(12) United States Patent
Uya

(10) Patent No.: US 7,825,001 B2
(45) Date of Patent: Nov. 2, 2010

(54) ELECTRONIC DEVICE, METHOD FOR MANUFACTURING THE SAME, AND SILICON SUBSTRATE FOR ELECTRONIC DEVICE

(75) Inventor: Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 105 days.

(21) Appl. No.: 12/032,390

(22) Filed: Feb. 15, 2008

(65) Prior Publication Data

US 2008/0197436 A1 Aug. 21, 2008

(30) Foreign Application Priority Data

Feb. 19, 2007 (JP) ............................ P2007-037881

(51) Int. Cl.
*H01L 21/76* (2006.01)
(52) U.S. Cl. ........................ 438/401; 438/738; 438/975; 257/E21.214
(58) Field of Classification Search ............... 438/40, 438/254, 494, 498, 634, 669, 670, 673, 924, 438/940, 401, 462, 975, 735, 738; 257/E21.214, 257/E21.316
See application file for complete search history.

(56) References Cited

U.S. PATENT DOCUMENTS

2004/0005729 A1 1/2004 Abe et al.
2006/0186560 A1 8/2006 Swain et al.
2008/0265348 A1* 10/2008 Maas et al. ................. 257/432

FOREIGN PATENT DOCUMENTS

| JP | 2002-151676 A | 5/2002 |
|----|---------------|--------|
| JP | 2003-204057 A | 7/2003 |
| JP | 2005-150521 A | 6/2005 |
| JP | 3722367 A | 9/2005 |

\* cited by examiner

*Primary Examiner*—Charles D Garber
*Assistant Examiner*—Hoa B Trinh
(74) *Attorney, Agent, or Firm*—Birch, Stewart, Kolasch & Birch, LLP

(57) ABSTRACT

An electronic device is formed by epitaxially growing a Si substrate on a Si layer of an SOI substrate in which the Si layer is deposited on a front surface of a substrate with an insulating layer interposed therebetween; forming an element on a front-surface side of the Si substrate; and forming a back-surface element aligned with respect to the element, on a back-surface side of the Si substrate after the substrate is etched. A mark is formed by etching and removing the Si layer and the insulating layer in a predetermined position of the SOI substrate. The element is formed using a concave part as a reference position. The concave part appears on the front surface of the Si substrate epitaxially grown on the mark. The back-surface element is formed using the mark as a reference position. The mark appears after the substrate is etched.

1 Claim, 5 Drawing Sheets

ELECTRONIC DEVICE, METHOD FOR MANUFACTURING THE SAME, AND SILICON SUBSTRATE FOR ELECTRONIC DEVICE

CROSS-REFERENCE TO RELATED APPLICATIONS

This application is based upon and claims the benefit of priority from the Japanese Patent Application No. 2007-37881 filed on Feb. 19, 2007, the entire contents of which are incorporated herein by reference.

BACKGROUND OF THE INVENTION

1. Technical Field

The invention relates to a silicon (Si) substrate or the like for manufacturing an electronic device, and more particularly to an electronic device that is manufactured by aligning elements formed on a front surface thereof and elements formed on a back surface thereof with high precision, a manufacturing method thereof, and a silicon substrate for the electronic device.

2. Description of the Related Art

When an electronic device is manufactured on a silicon substrate, there is a case where elements are formed on both a front surface and a back surface of the silicon substrate and the elements formed on the front surface are aligned with respect to the elements formed on the back surface. The "front surface" and "back surface" mean "one face" and "the other face" of a substrate, respectively.

For example, in a back-illuminated solid-state imaging device, as described in Japanese Patent No. 3722367 (corresponding to US 2004/005729 A), a plurality of photodiodes arranged in two-dimensional array and a signal reading-out circuit for reading out image signals detected by the photodiodes are formed on a front-surface side of the semiconductor substrate, while color filters and micro lenses are formed on a back-surface side of the semiconductor substrate.

In the back-illuminated solid-state imaging device, light is incident from a photographic subject to the back surface of the semiconductor substrate, and is received by the photodiodes provided on the front-surface side. Accordingly, when the color filter and the micro lens provided for each photodiode are not aligned with respect to the photodiode, color mixture or the like occurs.

For this reason, it is necessary to align the elements (color filers, micro lenses) provided on the back-surface side with the elements photodiodes, signal reading circuit, and the like) provided on the front-surface side.

In Japanese Patent No. 3722367, a back-surface mark is formed while viewing from the back-surface side through the semiconductor substrate, a metal layer or a silicide layer that is provided on the front-surface side. In this case, red or near-infrared light for which Si has low absorption rate is used as reference light. However, when a Si absorption layer is formed to have a sufficient thick (e.g., 10 μm) capable of absorbing most of visible light, signal intensity is hardly caught in the red reference light.

The near-infrared light having a wavelength of about 1.2 μm or less is absorbed by Si. Accordingly, the near-infrared light is not suitable for a thick Si-layer structure, and aligning with high precision cannot be achieved.

US 2006/0186560 A proposes a method for manufacturing a back-illuminated image sensor using a Si substrate in which a p layer having concentration gradient is grown by epitaxial growth on an SOI substrate with a thin seed layer deposited thereon. However, US 2006/0186560 A does not mention about forming a lattice-shaped light-shielding layer, a color filter, a micro lens, and the like on a back-surface side with high positional precision.

In the back-illuminated solid-state imaging element, when the light-shielding layer, the color filter, the micro lens, and the like provided on the back-surface side deviates from a structure of a pixel portion formed on the front-surface side of the silicon substrate, color mixture occurs. For this reason, it is important to reduce the deviation in a coordinate system between an alignment mark provided on the front-surface side and an alignment mark provided on the back-surface side.

When a size of a pixel becomes smaller than a thickness of a Si layer of a photodiode in order to arrange a large number of pixels in an imaging device, color mixture may further occur. Accordingly, a micro lens, a light-shielding element, and the like are required. As a width of the light-shielding element is increased, the color-mixture margin between two adjacent colors is also increased accordingly, but it means openings are narrowed as the color-mixture margin is increased, causing loss of sensitivity. It is noted that the color-mixture margin is the tendency of the color not to be mixed. For a micro pixel image sensor which employs a back-illuminated structure due to the decrease in pixel size and the shortage of sensitivity, there is a demand that the light-shielding element is formed as narrow as possible. Therefore, it has been desired to make the deviation in structure between the front-surface layer and the back-surface layer as narrow as possible.

The back-illuminated solid-state imaging element has been described above as an example. However, the above description is also applicable to the overall semiconductor device for forming elements aligned with high precision on the front and back surfaces.

SUMMARY OF THE INVENTION

The invention provides an electronic device in which elements formed on front and back surfaces are aligned with high precision, a method for manufacturing the same, and a silicon substrate for the electronic device.

According to an aspect of the invention, a method for manufacturing an electronic device includes: forming a back-surface mark by etching and removing a silicon layer and an insulating layer in a predetermined position of an SOI substrate in which the silicon layer is deposited on a front surface of a semiconductor substrate with the insulating layer interposed between the silicon layer and the semiconductor substrate; epitaxially growing a silicon substrate for the electronic device, on the silicon layer of the SOI substrate; forming a front-surface element on a front-surface side of the silicon substrate for the electronic device using a concave part as a reference position, wherein the concave part appears, on the front surface of the silicon substrate for the electronic device epitaxially grown on the back-surface mark; and forming a back-surface element, that is aligned with respect to the front-surface element, on a back-surface side of the silicon substrate for the electronic device after etching the semiconductor substrate of the SOI substrate, using the back-surface mark as a reference position, wherein the back-surface mark appears after the etching of the semiconductor substrate of the SOI substrate.

According to another aspect of the invention, an electronic device includes a silicon substrate, a front-surface element and a back-surface element. The silicon substrate for the electronic device is epitaxially grown on a silicon layer of an SOI substrate in which the silicon layer is deposited on a front surface of a semiconductor substrate with an insulating layer interposed therebetween. The front-surface element is formed on a front-surface side of the silicon substrate for the electronic device. The back-surface element is formed on a back-surface side of the silicon substrate for the electronic device after the semiconductor substrate of the SOI substrate is etched, with being aligned with respect to the front-surface element. A back-surface mark is formed by etching and removing the silicon layer and the insulating layer in a predetermined position of the SOI substrate. The front-surface element is formed using a concave part as a reference position, the concave part appearing, on the front surface of the silicon substrate for the electronic device epitaxially grown on the back-surface mark. The back-surface element is formed using the back-surface mark as a reference position. The back-surface mark appears after the semiconductor substrate is etched.

Also, the electronic device may be a hack-illuminated solid-state imaging element. The front-surface element may include a photoelectric conversion element and a signal reading-out unit. The back-surface element may include an optical element opposed to the photoelectric conversion element.

Also, the signal reading-out unit may include a charge transfer unit.

According to further another aspect of the invention, a silicon substrate for electronic device is manufactured by: epitaxially growing a silicon substrate on a silicon layer of an SOI substrate in which the silicon layer is deposited on a front surface of a semiconductor substrate with an insulating layer interposed therebetween; forming a front-surface element on a front-surface side of the silicon substrate; and forming a back-surface element, that is aligned with respect to the front-surface element, on a back-surface side of the silicon substrate after etching the semiconductor substrate of the SOI substrate. A back-surface mark is formed by etching and removing the silicon layer and the insulating layer in a predetermined position of the SOI substrate. The front-surface element is formed using a concave part as a reference position. The concave part appears, on the front surface of the silicon substrate for the electronic device formed on the back-surface mark. The back-surface element is formed using the back-surface mark as a reference. The back-surface mark appearing after the semiconductor substrate is etched.

According to the invention, a concave part formed on the basis of a back-surface mark is used as a front-surface mark, front-surface elements are positioned with reference to the front-surface mark, the back-surface elements are positioned with reference to the back-surface mark, and thus it is possible to align the front and back-surface elements so as to be opposed to each other with high precision.

DETAILED DESCRIPTION OF EMBODIMENTS OF THE INVENTION

Hereinafter, embodiments of the invention will be described with reference to the drawings.

Figure 1:
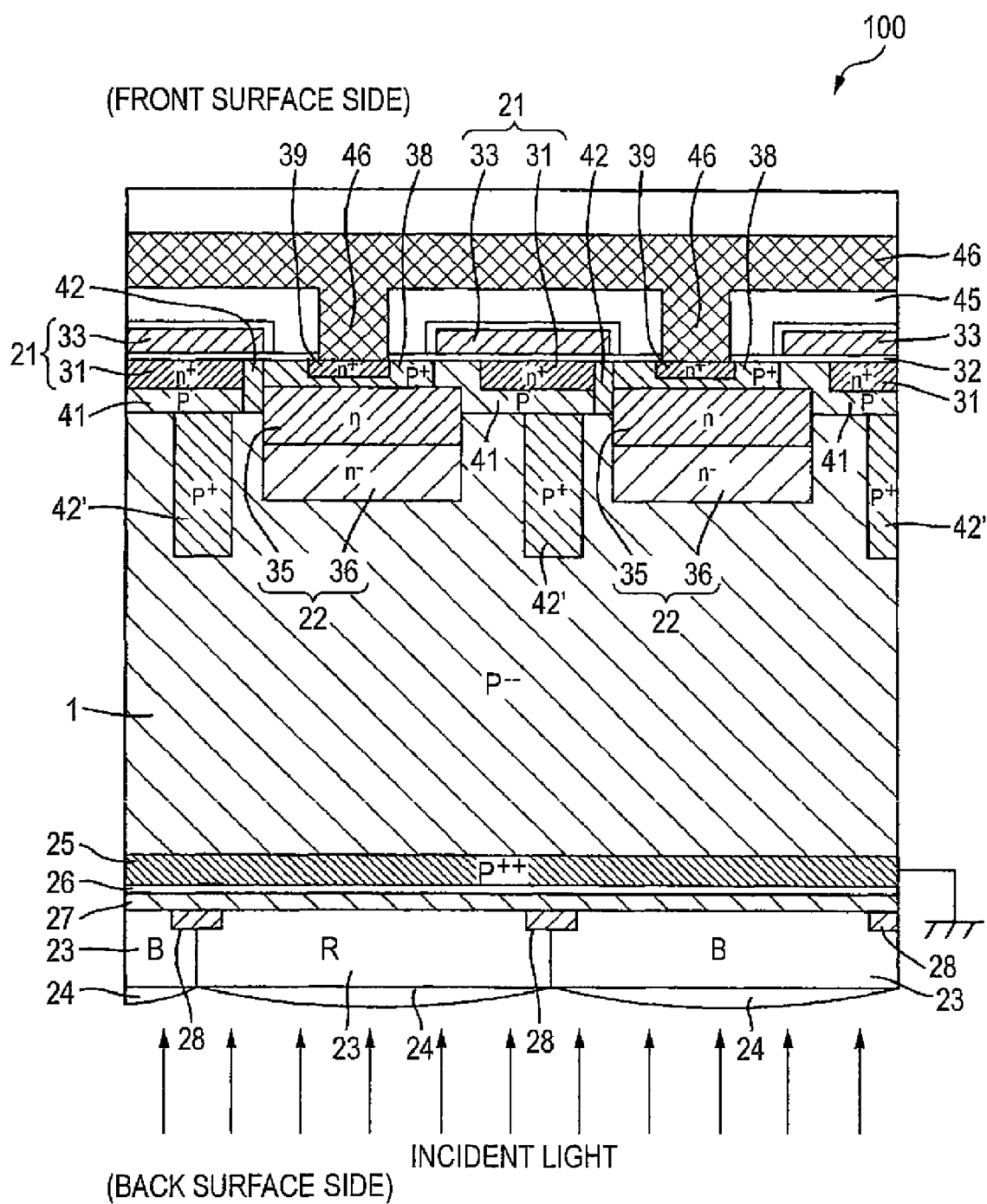
FIG. 1 is a sectional schematic diagram illustrating a back-illuminated solid-state imaging element according to an embodiment of the invention.

FIG. 1 is a sectional schematic view of a back-illuminated solid-state imaging element 100 according to an embodiment of the invention. The solid-state imaging element according to the embodiment is an interline type CCD. Vertical charge transfer paths (VCCD) 21 and photodiodes (photoelectric conversion elements) 22 are formed on a front-surface side of a p type semiconductor substrate 1. A color filter (red (R), green (G) and blue (B)) layer 23 and micro lenses 24 are laminated on a back-surface side thereof.

The back-illuminated solid-state imaging element 100 according to the embodiment is a CCD type. However, the invention is applicable to a CMOS type solid-state imaging element or other solid-state imaging elements in the same manner as described in Japanese Patent No. 3722367.

A high-concentration p layer 25 is formed on a surface of the semiconductor substrate 1 on the back-surface side, and the p layer 25 is grounded. An insulating layer 26, such as silicon oxide or silicon nitride, which is transparent with respect to incident light, is deposited on the high-concentration p layer 25. A high refractive index layer 27, which is transparent with respect to the incident light, such as silicon nitride or a diamond-structured carbon film, is deposited thereon. The color filter layer 23 and the micro lens (top lens) layer 24 are sequentially deposited thereon. Each micro lens 24 is formed based on an alignment mark which will be described later so as to focus on the center of the corresponding photodiode 22 opposed to each lens 24.

The color filter layer 23 is arranged in pixel (photodiode) units, and a light-shielding element 28 for preventing color mixture between pixels is provided in the color filter layer 23 on one side of the color filter layer 23 close to the semiconductor substrate 1 and between the adjacent pixel units.

The vertical charge transfer path (VCCD) 21 formed on the front-surface side of the semiconductor substrate 1 included a buried channel 31 of a high-concentration n layer and a transfer electrode film 33 which are deposited with a gate insulating film 32 interposed therebetween. The gate insulating layer 32 is formed of a silicon oxide film or an insulating film having an ONO (silicon-oxide film, silicon-nitride film, and silicon-oxide film) structure formed on the outermost surface on the front-surface side of the semiconductor substrate 1.

The vertical charge transfer paths 21 are formed to extend in a direction perpendicular to a direction in which a horizontal charge transfer path (HCCD) (not shown) extends. A number of vertical charge transfer paths 21 are formed. Between the adjacent vertical charge transfer paths 21, a plurality of photodiodes 22 are formed at a predetermined pitch in a direction along the vertical charge transfer paths 21.

In the embodiment, each photodiode 22 includes an n layer 35 formed on the front-surface side of the p type semiconductor substrate 1 and an n layer 36 formed below the n layer 35. A thin and high concentration p type layer 38 for suppressing dark current is formed on a front-surface portion of the n layer 35. An n+ layer 39 as a contact portion is formed on a central surface portion of the surface layer 38.

A p layer 41 having a higher p concentration than that of the substrate 1 is formed below the buried channel (n+ layer) 31 of the vertical charge transfer path 21. A P+ region 42 serving as an element separator is formed between (i) the n layer 31 and p layer 41 and (ii) the photodiode 22 located right from the n layer 31 and p layer 41, as shown in FIG. 1. A p+ region 42' having higher concentration than that of the semiconductor layer 1 is formed below each p layer 41, and each p+ region 42' separates two adjacent photodiodes 22. Each p+ region 42' is provided parting a boundary portion between adjacent pixel units, that is, a portion corresponding to the light-shielding member 28.

The p layer 41 formed below the buried channel 31 of the vertical charge transfer path 21 extends to a surface end portion of the n layer 35, which is located on the left side of the p layer 41, in the shown example. The p+ surface layer 38 at the end portion is located at a portion retreating from a right end surface of the n layer 35. The left end portion of the transfer electrode film 33 extends to overlap with the p layer 41 up to the left end portion of the p layer 41. The surface end portions of the transfer electrode film 33 and the p layer 41 slightly overlap with the n layer 35.

Such an overlapping configuration can be achieved because there is a sufficient area on the front-surface side of the semiconductor substrate 1 in the back-illuminated type. There is no sufficient area in the front-surface illumination type where light from a photograph subject is incident onto a front surface provided with the photodiode and the signal reading circuit. Accordingly, the end portion of the transfer electrode film can be extended only up to a position corresponding to the end portion of the photodiode. Thus, it is difficult to interpose a p layer therebetween.

As in this embodiment, when the p layer 41 is interposed between the transfer electrode film 33 and the n layer 35, it is possible to decrease a reading-out voltage applied to the transfer electrode film (used also as a reading-out electrode) 33 and to reduce power consumption of the CCD solid-state imaging device.

On the insulating layer 32 formed on the outmost surface of the semiconductor layer 1, the transfer electrode film 33 such as a polysilicon film is formed. The insulating layer 45 is deposited thereon. Openings are formed in the insulating layers 32 and 45 on the n+ layer 39, and a metallic electrode 46 is deposited on the insulating layer 45, thereby connecting the electrode 46 to the n+ layer 39. The electrode 46 serves as an overflow drain of the back-illuminated solid-state imaging device 100.

When an image of a photographic subject is imaged by the back-illuminated solid-state imaging device 100 having such a configuration, light from the photographic subject is incident through the back surface of the semiconductor substrate 1. The incident light is concentrated by the micro lens 24, passes through the color filter layer 23, and then enters the semiconductor layer 1.

When the light concentrated by the micro lens 24 enters the semiconductor substrate 1, the light travels while being concentrated toward the photodiode 22 corresponding to the micro lens 24 and the color filter 23. The light is gradually absorbed in the semiconductor substrate 1, and the light is photoelectrically converted to generate pairs of holes and electrons.

In the back-illuminated solid-state imaging device 100, a distance from the back surface of the semiconductor 1 to the n region 22 of the photodiode is about 9 µm. Accordingly, all the incident light is gradually absorbed in the semiconductor substrate 1 and photoelectrically converted until the light reaches the n+ region provided on the front-surface side of the semiconductor substrate 1, that is, the charge transfer path 21. Therefore, it is unnecessary to shield the vertical charge transfer path 21 from light.

The electrons generated in the photoelectric conversion region (a region from the p layer 25 to the n region 35) of each pixel are accumulated in the n region 35 of the corresponding pixel. When the reading-out voltage is applied to the transfer electrode film 33, which is also used as the reading-out electrode, the electrons are read out from the n region 35 to the buried channel 31 on the right side in the shown example. Then, the electrons are transferred to the horizontal charge transfer path (not shown) along the vertical charge transfer path 21, and are transferred to an amplifier along the horizontal charge transfer path. The amplifier outputs a signal voltage based on the amount of signal charges as an image signal.

Figure 2:
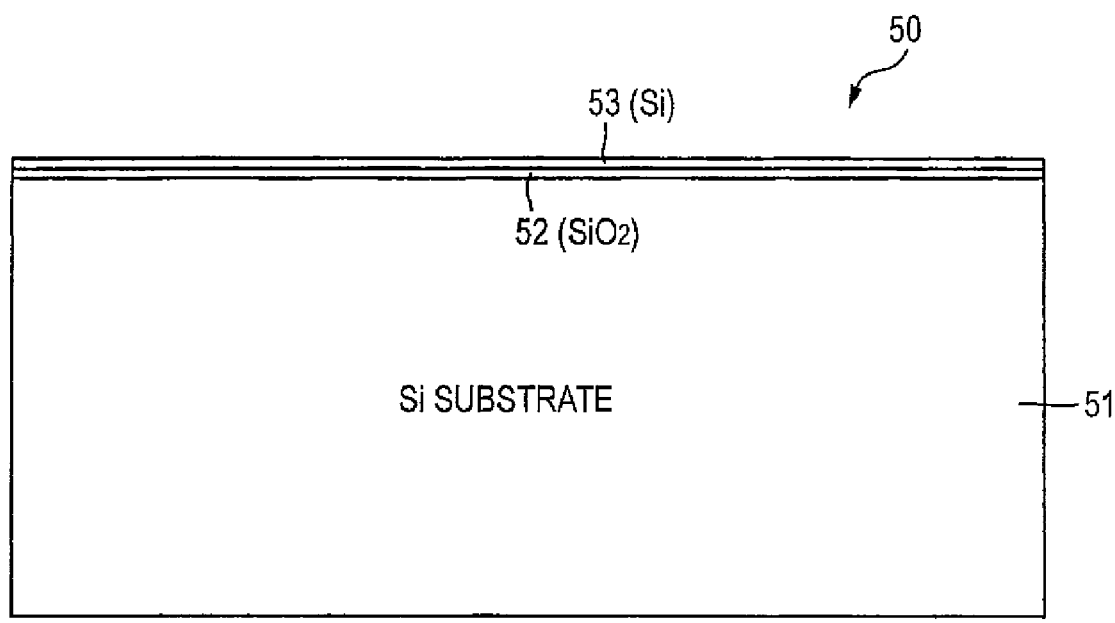
FIG. 2 is a diagram illustrating a manufacturing process of the back-illuminated solid-state imaging element shown in FIG. 1.

Next, a manufacturing process of the back-illuminated solid-state imaging device 100 will be described with reference to FIGS. 2 to 7. First, an SOI (Si-on-insulator) substrate 50 shown in FIG. 2 is prepared. The SOI substrate 50 includes a thick silicon substrate 51, an oxide film layer 52 formed on a surface of the thick silicon substrate 51, and a thin silicon layer 53 formed on a surface of the oxide film layer 52.

Figure 3:
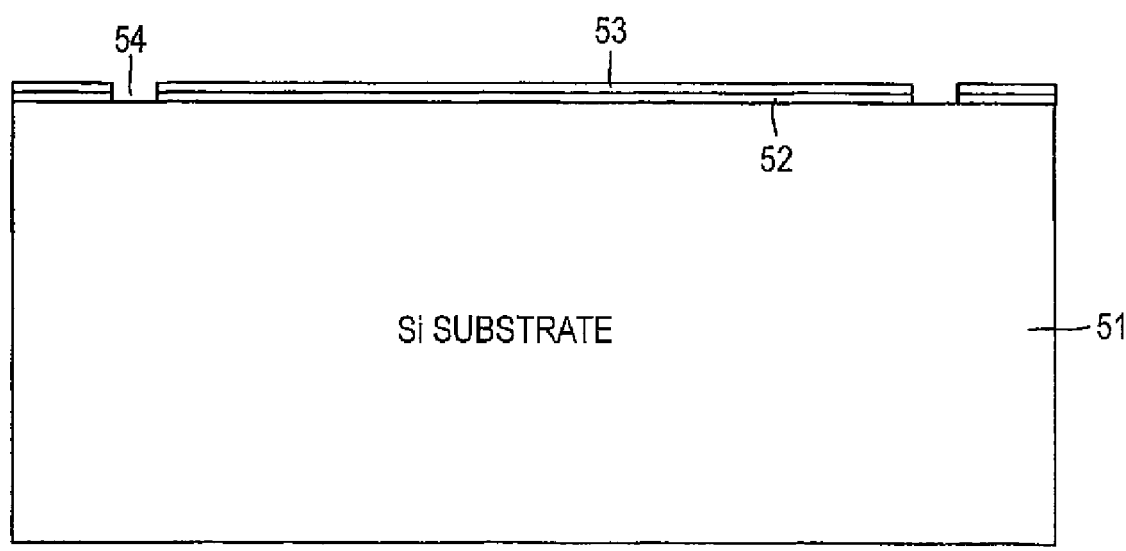
FIG. 3 is a diagram illustrating a manufacturing process after the manufacturing process shown in FIG. 2.

Then, as shown in FIG. 3, marks 54 are formed in predetermined positions of the surface of the SOI substrate. The marks 4 are formed by etching the thin silicon substrate 51. 53 and the oxide film layer 52 therebelow to expose the surface of the silicon substrate 51.

Figure 4:
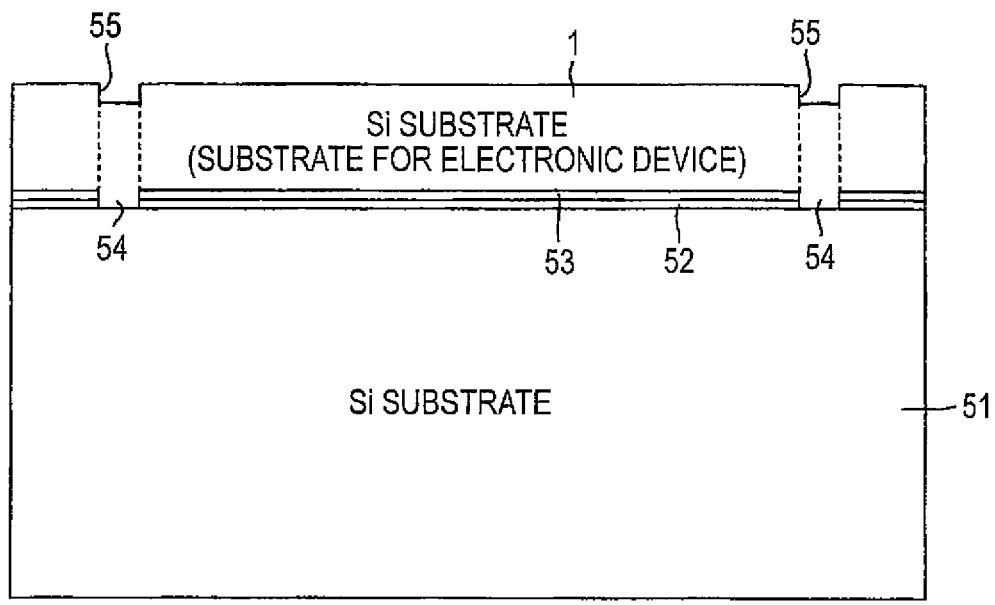
FIG. 4 is a diagram illustrating a manufacturing process after the manufacturing process shown in FIG. 3.

Then, as shown in FIG. 4, a p type silicon layer 1 having a thickness of about 10 µm is epitaxially grown on the surface of the SOI substrate 50 provided with the marks 54. The p type silicon layer 1 serves as the p type silicon substrate 1 in FIG. 1.

When the p type silicon layer 1 is epitaxially grown on the Si layer 53 of the SOI substrate 50 and on the marks 54 that exposes the silicon substrate 51, concave parts 55 are formed on a surface of the p type silicon layer 1 while being aligned with the mark 54.

Figure 5:
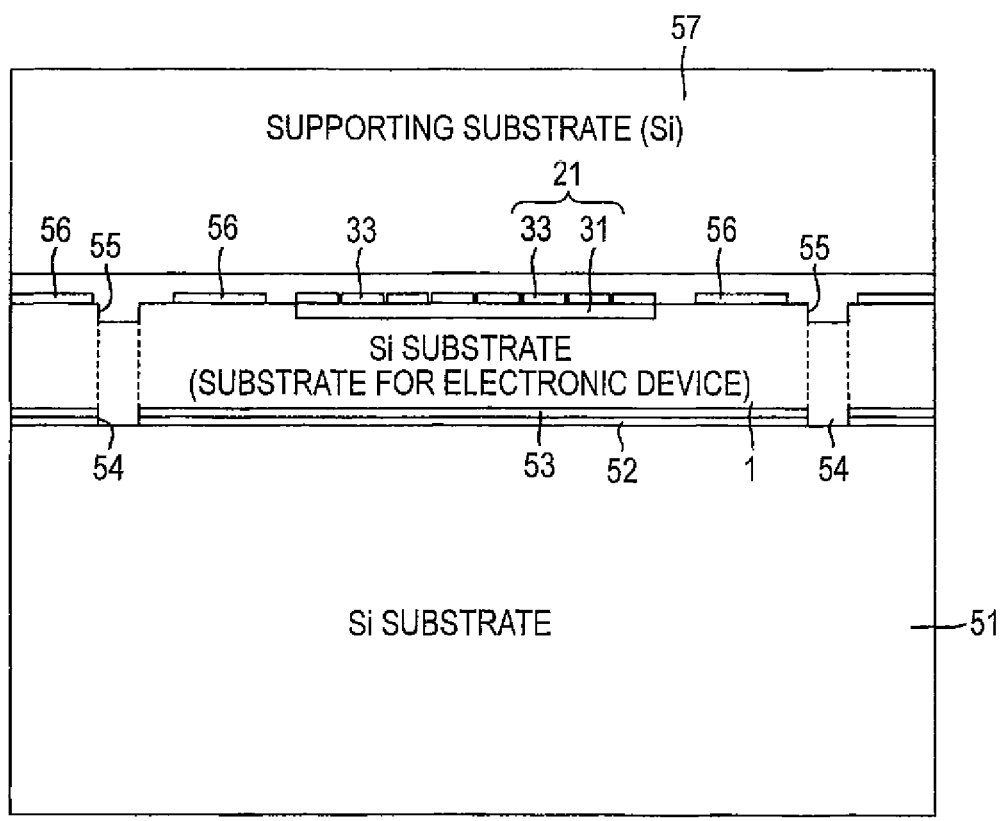
FIG. 5 is a diagram illustrating a manufacturing process after the manufacturing process shown in FIG. 4.

As shown in FIG. 5, using the concave parts 55 serving as alignment marks, front-surface elements such as the buried channel 31 and the transfer electrode film 33 formed thereon described with reference to FIG. 1, the photodiodes (not shown in FIG. 5), and an aluminum wiring layer 56 are formed on the front-surface side of the p type silicon layer 1.

After the elements are formed on the front-surface side of the p type silicon substrate 1, a supporting substrate 57 that supports the p type silicon substrate 1 is laminated onto the front surface.

Figure 6:
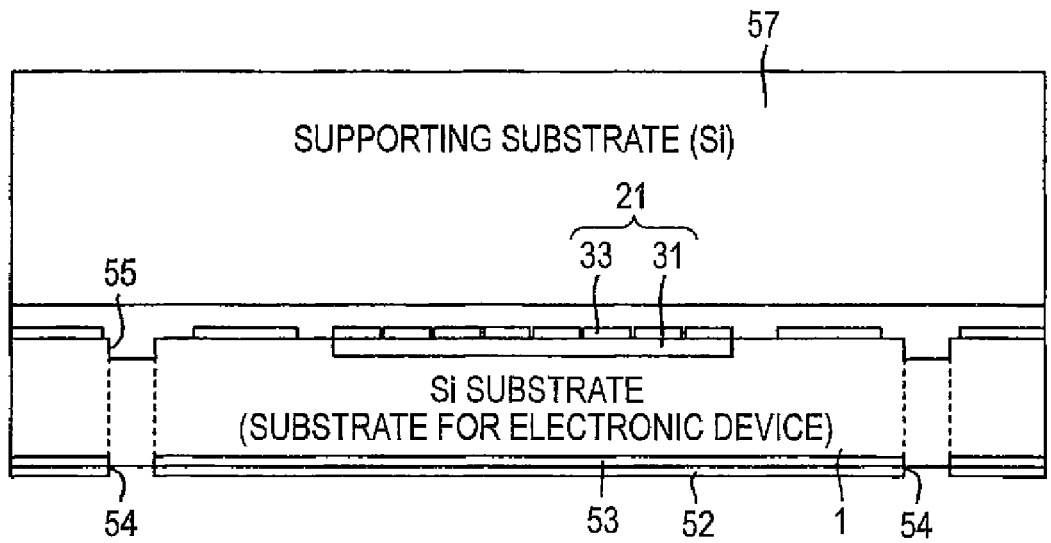
FIG. 6 is a diagram illustrating a manufacturing process after the manufacturing process shown in FIG. 5.

Then, as shown in FIG. 6, the silicon substrate (original substrate) 51 of the SOI substrate 50 shown in FIG. 5 is removed by etching. For example, when chemical etching is performed using KOH, the silicon substrate 51 is etched and the etching stops at the oxide film layer 52. However, the etching slightly progresses in positions of the marks 54 because there is no oxide film layer 52. The marks 54 are exposed as concave parts on the back-surface side of the p type semiconductor layer 1.

Then, although not shown, optical elements such as the color filters 23, the light-shielding members 28, and the micro lenses 24 described in FIG. 1 are formed on the back-surface side of the p type silicon substrate 1, using the alignment marks 54 as the aligning basis.

Accordingly, it is possible to align the back-surface elements with the front-surface elements with high precision, and it is also possible to make the width of the light-shielding element 28 as narrow as possible, thus preventing color mixture.

Figure 7:
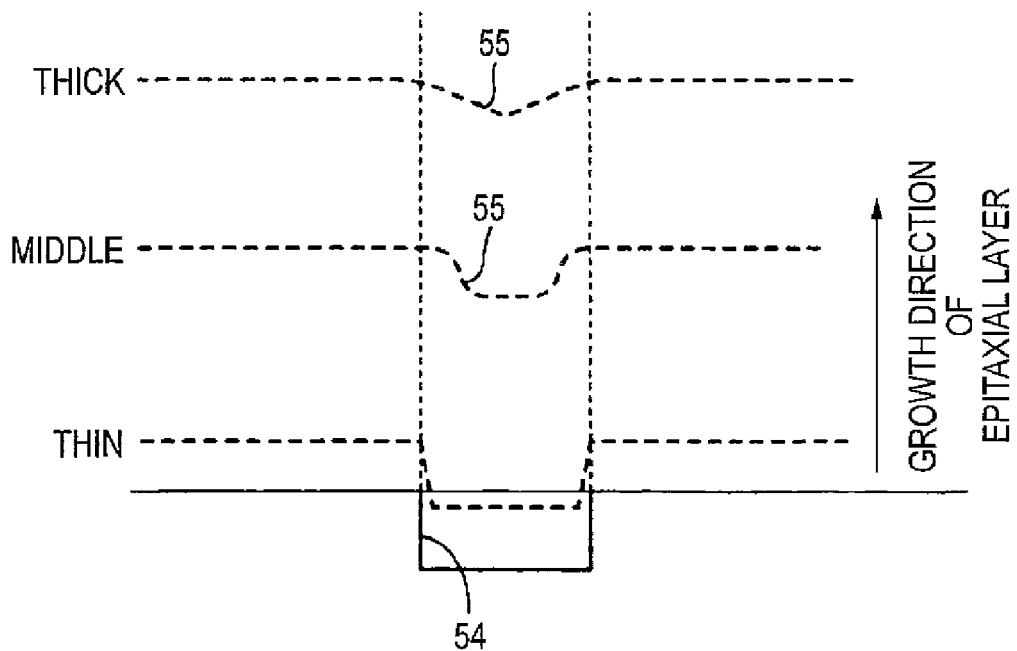
FIG. 7 is a diagram illustrating a relation between a front-surface mark and a back-surface mark shown in FIG. 6.

In FIGS. 2 to 6, the marks 55 which are formed above the mark 54 during the growth of the p type epitaxial layer 1 have the same size as the marks 54. However, actually, the size of the marks 55 gets narrower and shallower as the epitaxial layer 1 gets thicker as shown in FIG. 7. Accordingly, it is preferable to form the marks 54, taking the decrease in size into consideration. And, it is also preferable to form other marks based on the mark 55 instead of using the marks 55 directly as aligning basis, and then to form elements on the front-side surface while the formed elements are aligned with the other marks as the aligning basis.

In the embodiment described above, the back-illuminated solid-state imaging device 100 is described as an example. However; the embodiment described above is also applicable to general semiconductor devices in which elements and patterns are formed on both front and back surfaces.

Figure 8:
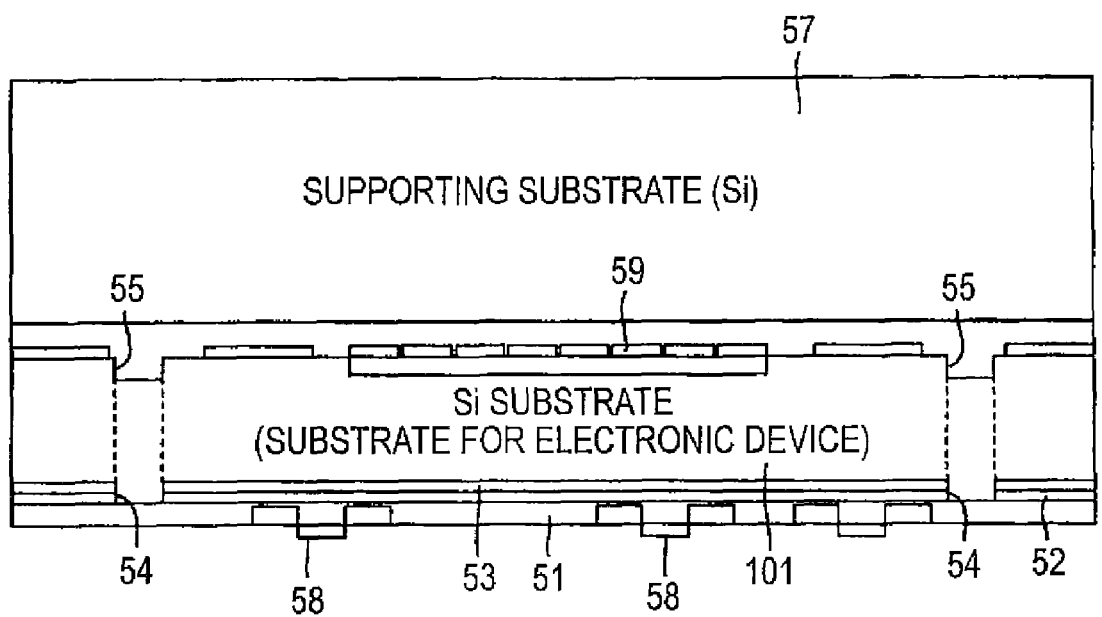
FIG. 8 is a sectional schematic diagram illustrating an electronic device according to another embodiment of the invention.

For example, in an electronic device shown in FIG. 8, a semiconductor integrated circuit 59 is formed on the front surface thereof, a Si substrate is used as the supporting substrate 57, and the Si substrate 57 is attached to the front surface of a substrate 101 for an electronic device with the Van der Waals' force. When the silicon substrate 51 of the SOI substrate 50 is etched, the silicon substrate 51 below the oxide film 52 is left thinly as a Si layer and devices such as an FET 58 are formed on the front surface of the thinly-left Si layer 51.

When the electronic devices 58 are formed on the back-surface side of the substrate 101, the marks 54 are not exposed to outside as "concave parts." However, the marks 54 are easily visible because the silicon layer 51 is thin. In addition, the marks 54 are easily visible because the crystallinity at the marks 54 is different from the vicinity of the mark 54 in the early stage of the epitaxial growth.

A silicon layer may be formed on the oxide film layer 52 after wholly removing the silicon substrate 51 by etching and then, an element may be formed on the silicon layer rather than on the semiconductor substrate 51. For example, the electronic devices may be formed on the oxide film layer 52 by the use of a polysilicon layer or an amorphous silicon layer formed at low temperature, or a silicon crystal layer formed by annealing them using a laser.

As described above, according to the embodiment, when the elements are formed on both front and back surfaces of the silicon substrate for electronic device 1, it is possible to align the front-surface elements and the back-surface elements with high precision and to manufacture the high-performance and high-quality electronic devices with low cost.

In the silicon substrate for electronic device according to the invention, it is possible to manufacture the high-performance and high-quality electronic devices because it is possible to perform highly precise alignment between the front surface and the back surface. In addition, when the back-illuminated solid-state imaging element is manufactured, it is possible to manufacture a solid-state imaging element with high aperture ratio, preventing color mixture.

What is claimed is:

1. A method for manufacturing an electronic device, the method comprising:
    forming a back-surface mark by etching and removing a silicon layer and an insulating layer in a predetermined position of an SOI substrate in which the silicon layer is deposited on a front surface of a semiconductor substrate with the insulating layer interposed between the silicon layer and the semiconductor substrate;
    epitaxially growing a silicon substrate on the silicon layer of the SOI substrate;
    forming a front-surface element on a front-surface side of the silicon substrate using a concave part as a reference position, wherein the concave part appears on the front surface of the silicon substrate for the electronic device epitaxially grown on the back-surface mark; and
    etching the semiconductor substrate of the SOI substrate on which the front-surface element was formed;
    forming a back-surface element on a back-surface side of the silicon substrate using the back-surface mark as a reference position after etching of the semiconductor substrate of the SOI substrate, wherein the back-surface mark appears after the etching of the semiconductor substrate of the SOI substrate.

* * * * *